(12) United States Patent
Yamamoto

(10) Patent No.: US 7,184,102 B2
(45) Date of Patent: Feb. 27, 2007

(54) TELEVISION TUNER HAVING INPUT AND OUTPUT SIGNALS SUFFICIENTLY ISOLATED FROM EACH OTHER

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 461 days.

(21) Appl. No.: 10/783,296

(22) Filed: Feb. 20, 2004

(65) Prior Publication Data

US 2004/0169775 A1 Sep. 2, 2004

(30) Foreign Application Priority Data

Feb. 27, 2003 (JP) ............... 2003-000963

(51) Int. Cl.
H04N 5/50 (2006.01)
H04N 5/44 (2006.01)

(52) U.S. Cl. ...................... 348/731; 348/725

(58) Field of Classification Search ........ 348/731–733, 348/725, 728, 818–820; 455/300, 301, 190.1, 455/191.1, 192.3; 334/85; *H04N 5/50, 5/44*
See application file for complete search history.

(56) References Cited

U.S. PATENT DOCUMENTS 6,400,419 B1 * 6/2002 Yamamoto ................. 348/731
7,030,940 B2 * 4/2006 Sasaki ....................... 348/731
2005/0046750 A1 * 3/2005 Yamamoto ................. 348/731
2005/0073612 A1 * 4/2005 Yamamoto ................. 348/731

FOREIGN PATENT DOCUMENTS

JP          AI 5-21537          3/1993

* cited by examiner

*Primary Examiner*—Sherrie Hsia
(74) *Attorney, Agent, or Firm*—Brinks Hofer Gilson & Lione

(57) ABSTRACT

A television tuner includes a metal frame having four side plates. The area inside the frame is divided by a shield plate into a first division adjacent to a first side plate and a second division adjacent to a second side plate opposite to the first side plate. A first connector receiving a television signal is disposed on a third side plate forming the first division. The first division contains a first wideband amplifier adjacent to the first connector and a distributor between the first wideband amplifier and a fourth side plate to be adjacent to the first wideband amplifier. A second connector that outputs one of two signal components split in the distributor is disposed on the first side plate. A tuning section is disposed in the second division. Other wideband amplifiers may provide isolation between the distributor, the second connector, and the tuning section.

22 Claims, 2 Drawing Sheets

TELEVISION TUNER HAVING INPUT AND OUTPUT SIGNALS SUFFICIENTLY ISOLATED FROM EACH OTHER This application claims the benefit of priority to Japanese Patent Application No. 2003-000963, herein incorporated by reference in its entirety.

BACKGROUND OF THE INVENTION

1. Field of the Invention

The present invention relates to a television tuner. In particular, the present invention relates to the layout in a television tuner suitable for a dual-screen television receiver for splitting an input television signal into two television signal components, one of which is converted to an intermediate-frequency signal component and the other of which is output externally.

2. Description of the Related Art

FIG. 2 is a schematic plan view showing the layout of component blocks of a known television tuner. The known television tuner includes a box-shaped metal frame 51 having a first side plate 51a; a second side plate 51b opposite to the first side plate 51a; a third side plate 51c; and a fourth side plate 51d. The television tuner further includes a first shield plate 52; a second shield plate 53; a third shield plate 54; and a fourth shield plate 55. The shield plates 52 to 54 are disposed parallel to one another in that order from the third side plate 51c to the fourth side plate 51d, and bridge the side plates 51a and 51b. The fourth shield plate 55 bridges the shield plates 53 and 54.

The area inside the metal frame 51 is divided into a first compartment 56 between the third side plate 51c and the first shield plate 52; a second compartment 57 between the first shield plate 52 and the second shield plate 53; a third compartment 58 enclosed by the first side plate 51a, the second shield plate 53, the third shield plate 54, and the fourth shield plate 55; a fourth compartment 59 enclosed by the second side plate 51b, the second shield plate 53, the third shield plate 54, and the fourth shield plate 55; and a fifth compartment 60 between the third shield plate 54 and the fourth side plate 51d.

In the metal frame 51, the shield plates 52 to 55 stand upright (i.e. the height direction is in the plane of the paper, from the second side plate 51b to the first side plate 51a) and circuit boards (not shown) for mounting various circuits are disposed in the compartments 56 to 60.

The third side plate 51c has a first connector 61, which is a television-signal-receiving connector, mounted thereon at a portion adjacent to the first side plate 51a. The first side plate 51a has a second connector 62, which is a television-signal-outputting connector, mounted thereon at a portion interfacing with the first compartment 56. The second side plate 51b has a plurality of terminals 63 mounted in line thereon such that the terminals 63 are separated from one another at substantially identical intervals.

The reason for the first connector 61 being disposed adjacent to the first side plate 51a is to ensure a sufficient height of the first connector 61 from the second side plate 51b when the motherboard (not shown) of a television receiver is connected to the terminals 63.

The first compartment 56 contains a first wideband amplifier 64 for amplifying an input television signal; a distributor 65 for splitting the television signal into two television signal components; and a second wideband amplifier 66 for amplifying one of the two television signal components. The first wideband amplifier 64 is disposed close to the first connector 61. The distributor 65 is disposed between the second connector 62 and the first wideband amplifier 64 such as to be close to the second connector 62. The second wideband amplifier 66 is disposed opposite to the distributor 65 with respect to the first wideband amplifier 64; in other words, the second wideband amplifier 66 is disposed adjacent to the second side plate 51b.

The second to fifth compartments 57 to 60 contain circuits constituting a tuning section. In detail, the second compartment 57 contains an input tuning circuit 67, which includes a tuning circuit for the UHF and VHF bands. The input tuning circuit 67 has its input terminal disposed adjacent to the first side plate 51a.

Underneath the second shield plate 53 (on the bottom surface of the circuit board) are provided a UHF amplifier 68 and a VHF amplifier 69. The third compartment 58 contains a UHF-band interstage tuning circuit 70 and the fourth compartment 59 contains a VHF-band interstage tuning circuit 71. The fifth compartment 60 contains an oscillator 72 and a mixer 73.

In the known television tuner described above, a television signal input to the first wideband amplifier 64 via the first connector 61 is split into two television signal components in the distributor 65. One of the two television signal components is input to the input tuning circuit 67 via the second wideband amplifier 66. The television signal component is converted to an intermediate-frequency signal in the mixer 73 and is finally output from the terminals 36. The other of the two television signal components split in the distributor 65 is output from the second connector 62 to another television tuner.

In the known television tuner described above, the distance between the third side plate 51c and the first shield plate 52 is small, i.e., the area of the first compartment 56 is small. For this reason, the second wideband amplifier 66 is disposed opposite to the distributor 65 with respect to the first wideband amplifier 64; in other words, the second wideband amplifier 66 is disposed adjacent to the second side plate 51b. Thus, when a television signal output from the first wideband amplifier 64 is passed to the distributor 65 and one of the two television signal components split in the distributor 65 is input to the input tuning circuit 67 via the second wideband amplifier 66, the television signal travels first in one direction, then in the opposite direction, and again in the one direction. This causes the distributor 65 to have its input and output terminals poorly isolated from each other and the second wideband amplifier 66 to have its input and output terminals poorly isolated from each other, resulting in the television signal entering the input tuning circuit 67 being poorly isolated from the television signal output to the second connector 62. Thus, channel switching undesirably causes noise to be mixed with another, externally connected tuner.

SUMMARY OF THE INVENTION

Accordingly, an embodiment of the present invention provides a television tuner in which two split television signal components, one entering the tuning section and the other being provided essentially directly to an external terminal, are sufficiently isolated from each other.

According to an aspect of the present invention, a television tuner includes a conductive frame having a first side plate, a second side plate opposite to the first side plate, a third side plate, and a fourth side plate. A first shield plate divides the frame into a first division adjacent to the first side plate and a second division adjacent to the second side plate.

A distributing section includes at least a distributor that splits one television signal into two television signal components. A tuning section converts the frequency of a first of the two television signal components into an intermediate-frequency signal. A first connector receives the television signal and a second connector outputs the second television signal component. In this television tuner, the first connector is disposed on the third side plate at a portion forming the first division, the second connector is disposed on the first side plate, the distributing section is disposed in the first division, and the tuning section is disposed in the second division. As a result, the two television signal components propagate in opposite directions to each other, one to the second connector and the other to the tuning section. Therefore, the two signal components hardly interfere with each other, ensuring isolation between the two signal components.

The distributing section may include a first wideband amplifier connected between the first connector and the distributor. The first wideband amplifier is disposed in the first division and close to the first connector and the distributor is disposed between the first wideband amplifier and the fourth side plate such as to be adjacent to the first wideband amplifier. As a result, the noise figure (NF) due to distribution loss can be reduced and the first wideband amplifier can have its input and output sufficiently isolated from each other.

The television tuner may include a second wideband amplifier connected between the distributor and the tuning section. The second wideband amplifier is disposed between the distributor and the shield plate such as to be close to the distributor. As a result, the television signal can be input to the tuning section along the shortest possible route, and the signal coming to the tuning section can be sufficiently isolated from the signal propagating in the opposite direction with respect to the distributor.

The television tuner may include a third wideband amplifier connected between the distributor and the second connector. The third wideband amplifier is disposed between the distributor and the first side plate or the fourth side plate such as to be adjacent to the distributor, and the second connector is disposed on the first side plate at a portion interfacing with the third wideband amplifier. As a result, the television signal can be input to the second connector along the shortest possible route, and the signal sent to the second connector can be sufficiently isolated from the signal propagating in the opposite direction with respect to the distributor. The distributing section may further comprise a first wideband amplifier connected between the first connector and the distributor in which the first wideband amplifier is disposed in the first division and is closer to the first connector than other electronic components in the first division, and the distributor is disposed between the first wideband amplifier and the fourth side plate and is adjacent to the first wideband amplifier. In this case, the television tuner may further comprise a second wideband amplifier connected between the distributor and the tuning section, and which is disposed between the distributor and the first shield plate and/or a third wideband amplifier connected between the distributor and the second connector and which is disposed between at least one of the distributor and the first side plate and between the distributor and the fourth side plate.

The distributing section may comprise a plurality of wideband amplifiers disposed such that a first of the wideband amplifiers is connected between the distributor and the first connector, a second of the wideband amplifiers is connected between the distributor and the second connector, and a third of the wideband amplifiers is connected between the distributor and the tuning section. In this case, the television signal components from the second of the wideband amplifiers to the second connector and from the third of the wideband amplifiers to the tuning section may propagate primarily in opposite directions.

In fact, in the television tuner, the television signal components from the distributor to the second connector and from the distributor to the tuning section may or may not propagate in the same direction.

The tuning section may include an input tuning circuit, an interstage tuning circuit, an oscillator, a mixer, a second shield plate bridging the first shield plate and the second side plate, and a third shield plate bridging the first shield plate and the fourth side plate. The second division then contains a first compartment bounded by the third side plate and the second shield plate and that encloses the input tuning circuit, a second compartment bounded by the second shield plate and the third shield plate and that encloses the interstage tuning circuit and the mixer, and a third compartment bounded by the first shield plate, the third shield plate, and the fourth side plate and that encloses the oscillator. The third shield plate may be L-shaped and/or the tuning section include a high-frequency amplifier connected between the input tuning circuit and the interstage tuning circuit.

DESCRIPTION OF THE PREFERRED EMBODIMENTS

Figure 1:
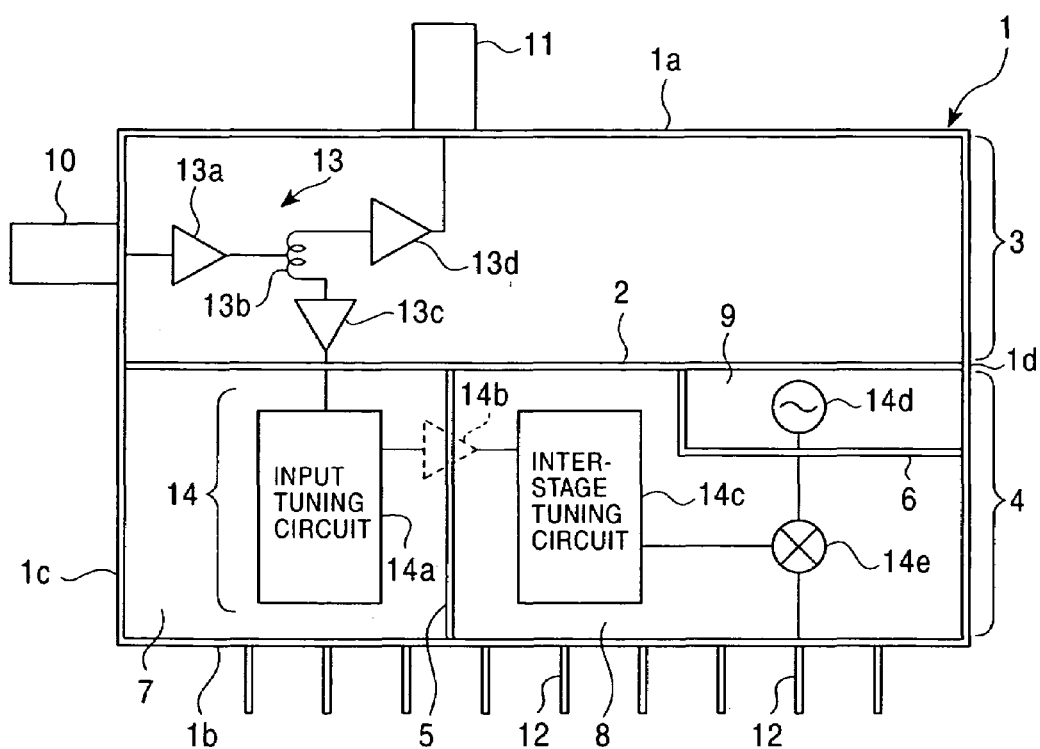
FIG. 1 is a plan view showing the layout of component blocks of a television tuner according to the present invention.
Figure 2:
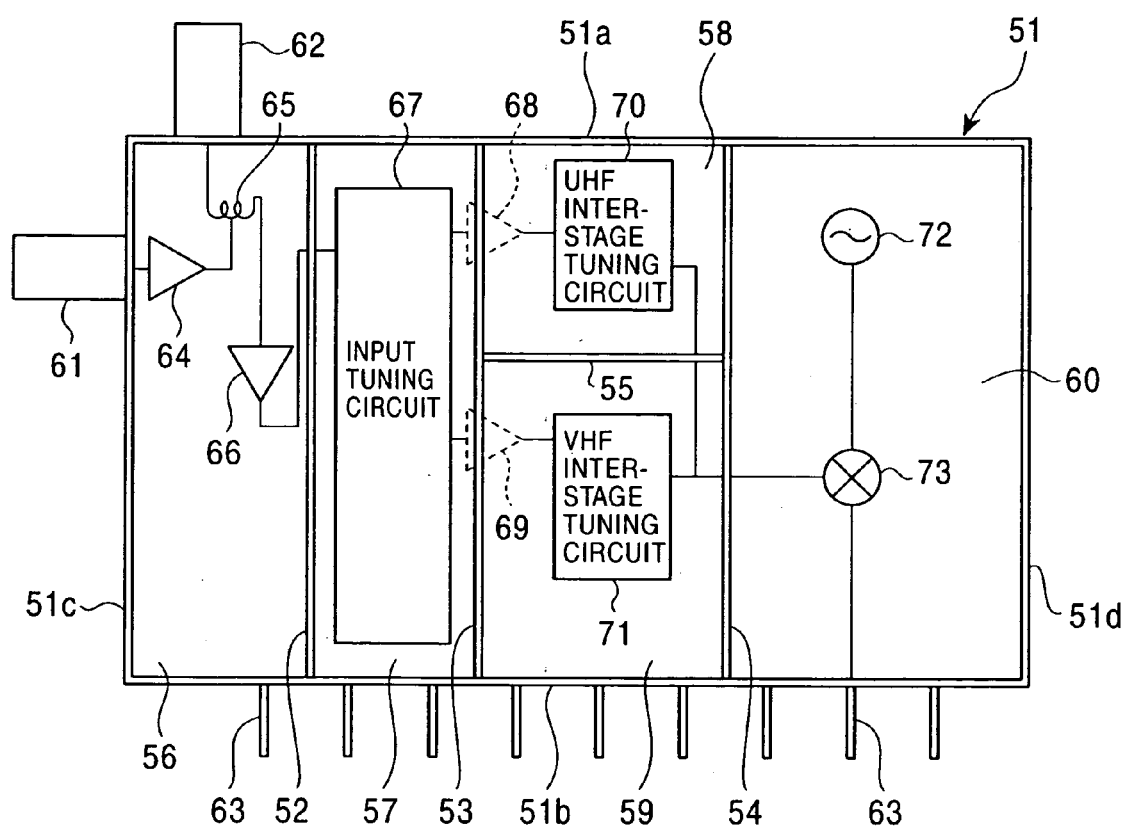
FIG. 2 is a plan view showing the layout of component blocks of the known television tuner.

FIG. 1 is a schematic plan view showing the layout of component blocks of a television tuner according to the present invention. The television tuner includes a box-shaped metal frame 1 having a first side plate 1a; a second side plate 1b opposite to the first side plate 1a; a third side plate 1c; and a fourth side plate 1d. The television tuner further includes a first shield plate 2 which is parallel with the second side plate 1b and bridges the third side plate 1c and the fourth side plate 1d. The area inside the metal frame 1 is divided into a first division 3 between the first side plate 1a and the first shield plate 2 and a second division 4 between the second side plate 1b and the first shield plate 2.

The television tuner further includes a second shield plate 5 bridging the first shield plate 2 and the second side plate 1b; and an L-shaped third shield plate 6 bridging the first shield plate 2 and the fourth side plate 1d. The second division 4 is further divided into a first compartment 7 between the third side plate 1c and the second shield plate 5; a second compartment 8 between the second shield plate 5 and the third shield plate 6; and a third compartment 9 enclosed by the first shield plate 2, the third shield plate 6, and the fourth side plate 1d.

In the metal frame 1, the shield plates 2, 5, and 6 stand upright and circuit boards (not shown) for mounting various circuits are disposed in the first division 3 and the second division 4 (the compartments 7 to 9). The compartments 7 to 9 have different sizes from each other and may be sized to minimize the amount of space used by the metal frame 1.

The third side plate 1c has a first connector 10, which is a television-signal-receiving connector, mounted thereon at a portion interfacing with the first division 3. The first side plate 1a has a second connector 11, which is a television-signal-outputting connector, mounted thereon. The second side plate 1b has a plurality of terminals 12 mounted in line thereon such that the terminals 12 are separated from one another at substantially identical intervals.

One reason for the first connector 10 being disposed at a position interfacing with the first division 3 is to ensure a sufficient distance of the first connector 10 from the second side plate 1b when the motherboard (not shown) of a television receiver is connected to the terminals 12.

The first division 3 contains a distributing section 13 for splitting an input television signal into two television signal components. The distributing section 13 includes a first wideband amplifier 13a for amplifying an input television signal; a distributor 13b for splitting the amplified television signal into two television signal components; a second wideband amplifier 13c for amplifying one of the two television signal components; and a third wideband amplifier 13d for amplifying the other television signal component. While the embodiment illustrated in FIG. 1 shows multiple wideband amplifiers, the first, second, and third wideband amplifiers 13a, 13c, and 13d may not be essential. The first wideband amplifier 13a preceding the distributor 13b is advantageous in reducing the noise figure (NF) due to distribution loss.

The first wideband amplifier 13a is disposed adjacent to the first connector 10. The distributor 13b is disposed between the first wideband amplifier 13a and the fourth side plate 1d such as to be adjacent to the first wideband amplifier 13a.

The second wideband amplifier 13c is disposed between the distributor 13b and the first shield plate 2 such as to be adjacent to the distributor 13b. The third wideband amplifier 13d is disposed between the distributor 13b and the fourth side plate 1d or the first side plate 1a such as to be adjacent to the distributor 13b. The second connector 11 is disposed at a portion on the first side plate 1a adjacent to the third wideband amplifier 13d.

The second division 4 contains a tuning section 14, which includes an input tuning circuit 14a, a high-frequency amplifier 14b, an interstage tuning circuit 14c, an oscillator 14d, a mixer 14e, and other components (not shown). The input tuning circuit 14a includes a tuning circuit for the UHF band and a tuning circuit for the VHF band, and is disposed at a portion in the first compartment 7 adjacent to the second wideband amplifier 13c. The high-frequency amplifier 14b includes two circuits for the UHF band and the VHF band, and is disposed underneath the second shield plate 5 (on the bottom surface of the circuit board). The interstage tuning circuit 14c also includes a tuning circuit for the UHF band and a tuning circuit for the VHF band, and is disposed in the left-half area (adjacent to the second shield plate 5) of the second compartment 8. The oscillator 14d is disposed in the third compartment 9. The mixer 14e is disposed in the right-half area (adjacent to the fourth side plate 1d) of the second compartment 8.

In the television tuner described above, a television signal input to the first wideband amplifier 13a via the first connector 10 is amplified and then split into two television signal components in the distributor 13b. One of the two television signal components is input to the input tuning circuit 14a in the first compartment 7 via the second wideband amplifier 13c. The television signal component is input to the mixer 14e via the high-frequency amplifier 14b and the interstage tuning circuit 14c, is mixed with an oscillating signal into an intermediate-frequency signal in the mixer 14e, and is finally output from the terminals 12. The other of the two television signal components split in the distributor 13b is output from the second connector 11 to another television tuner via the third wideband amplifier 13d.

In the television tuner described above, one of the two television signal components split in the distributor 13b goes into the second division 4, which is shielded from the first division 3 by the first shield plate 2, whereas the other television signal component goes into the second connector 11 on the first side plate 1a. Thus, the two television signal components propagate primarily in opposite directions to each other, and therefore hardly interfere with each other. In addition, the two television signal components pass through the respective wideband amplifiers 13c and 13d, and hence the interference between the television signal components at the outputs of the wideband amplifiers 13c and 13d is further reduced, ensuring isolation between the television signal components.

What is claimed is:

1. A television tuner comprising:
a conductive frame having a first side plate, a second side plate opposite to the first side plate, a third side plate, and a fourth side plate;
a first shield plate, which is substantially planar with the second side plate, divides the frame into a first division adjacent to the first side plate and a second division adjacent to the second side plate;
a distributing section including a distributor that splits one television signal into two television signal components;
a tuning section that converts a frequency of a first of the two television signal components into an intermediate-frequency signal;
a first connector that receives the television signal; and
a second connector from which a second of the two television signal components is output,
wherein the first connector is disposed on the third side plate at a portion forming the first division, the second connector is disposed on the first side plate, the distributing section is disposed in the first division, and the tuning section is disposed in the second division.

2. The television tuner according to claim 1, the distributing section further comprising a first wideband amplifier connected between the first connector and the distributor,
wherein the first wideband amplifier is disposed in the first division and close to the first connector, and
wherein the distributor is disposed between the first wideband amplifier and the fourth side plate and adjacent to the first wideband amplifier.

3. The television tuner according to claim 2, further comprising a second wideband amplifier connected between the distributor and the tuning section,
wherein the second wideband amplifier is disposed between the distributor and the first shield plate and close to the distributor.

4. The television tuner according to claim 2, further comprising a third wideband amplifier connected between the distributor and the second connector,
wherein the third wideband amplifier is disposed between the distributor and the first side plate or the fourth side plate and adjacent to the distributor, and
wherein the second connector is disposed on the first side plate at a portion interfacing with the third wideband amplifier.

5. The television tuner according to claim 1, the distributing section further comprising a first wideband amplifier connected between the first connector and the distributor,
wherein the first wideband amplifier is disposed in the first division and is closer to the first connector than other electronic components in the first division, and
wherein the distributor is disposed between the first wideband amplifier and the fourth side plate and is adjacent to the first wideband amplifier.

6. The television tuner according to claim 5, further comprising a second wideband amplifier connected between the distributor and the tuning section,
wherein the second wideband amplifier is disposed between the distributor and the first shield plate.

7. The television tuner according to claim 5, further comprising a third wideband amplifier connected between the distributor and the second connector,
wherein the third wideband amplifier is disposed between at least one of the distributor and the first side plate and between the distributor and the fourth side plate.

8. The television tuner according to claim 1, the distributing section further comprising a plurality of wideband amplifiers disposed such that a first of the wideband amplifiers is connected between the distributor and the first connector, a second of the wideband amplifiers is connected between the distributor and the second connector, and a third of the wideband amplifiers is connected between the distributor and the tuning section.

9. The television tuner according to claim 8, wherein the television signal components from the second of the wideband amplifiers to the second connector and from the third of the wideband amplifiers to the tuning section propagate primarily in opposite directions.

10. The television tuner according to claim 1, wherein the television signal components from the distributor to the second connector and from the distributor to the tuning section do not propagate in the same direction.

11. The television tuner according to claim 1, further comprising a means for reducing a noise figure due to distribution loss disposed between the first connector and the distributor.

12. The television tuner according to claim 1, wherein
the tuning section includes an input tuning circuit, an interstage tuning circuit, an oscillator, a mixer, a second shield plate bridging the first shield plate and the second side plate, and a third shield plate bridging the first shield plate and the fourth side plate, and
the second division contains a first compartment bounded by the third side plate and the second shield plate and that encloses the input tuning circuit, a second compartment bounded by the second shield plate and the third shield plate and that encloses the interstage tuning circuit and the mixer, and a third compartment bounded by the first shield plate, the third shield plate, and the fourth side plate and that encloses the oscillator.

13. The television tuner according to claim 12, wherein the third shield plate is L-shaped.

14. The television tuner according to claim 12, wherein the tuning section further includes a high-frequency amplifier connected between the input tuning circuit and the interstage tuning circuit.

15. A television tuner comprising:
a conductive frame having a plurality of side plates;
a plurality of shield plates dividing the frame into a plurality of sections and at least one of the sections into a plurality of sub-sections;
a distributing section including a distributor that splits a television signal into a plurality of television signal components;
a tuning section that converts a frequency of a first of the television signal components into an intermediate-frequency signal, the tuning section containing first and second tuning circuits, a mixer and an oscillator;
a first connector that receives the television signal;
a second connector from which a second of the television signal components is output; and
a plurality of terminals mounted on one side plate such that the terminals are separated from one another at substantially identical intervals,
wherein the distributing section and the tuning section divide the frame such that the distributing section is disposed more distal to the terminals than the tuning section, and
wherein the first and second connectors are disposed on different side plates, the second tuning circuit is disposed in a first sub-section, the first tuning circuit and mixer are disposed in a second sub-section, and the oscillator is disposed in a third sub-section.

16. The television tuner according to claim 15, the distributing section further comprising a plurality of wideband amplifiers disposed such that a first of the wideband amplifiers is connected between the distributor and the first connector, a second of the wideband amplifiers is connected between the distributor and the second connector, and a third of the wideband amplifiers is connected between the distributor and the tuning section.

17. The television tuner according to claim 16, wherein the television signal components from the second of the wideband amplifiers to the second connector and from the third of the wideband amplifiers to the tuning section propagate primarily in opposite directions.

18. The television tuner according to claim 16, wherein the television signal components from the distributor to the second connector and from the distributor to the tuning section do not propagate in the same direction.

19. The television tuner according to claim 15, further comprising a means for reducing a noise figure due to distribution loss disposed between the first connector and the distributor.

20. The television tuner according to claim 15, wherein the sub-sections have different sizes and shapes.

21. The television tuner according to claim 15, wherein the distributing section and the tuning section bisect the frame such that the distributing section and the tuning section are substantially equal in size.

22. The television tuner according to claim 1, wherein the first shield plate bridges the third side plate and the fourth side plate.

* * * * *

UNITED STATES PATENT AND TRADEMARK OFFICE
CERTIFICATE OF CORRECTION

| | | |
|---|---|---|
| PATENT NO. | : 7,184,102 B2 | Page 1 of 1 |
| APPLICATION NO. | : 10/783296 | |
| DATED | : February 27, 2007 | |
| INVENTOR(S) | : Masaki Yamamoto | |

It is certified that error appears in the above-identified patent and that said Letters Patent is hereby corrected as shown below:

<u>On the Title Page</u>; item (56)

In column 2, line 1, under "FOREIGN PATENT DOCUMENTS", delete "AI" before "5-21537".

Signed and Sealed this

Twenty-fourth Day of July, 2007

JON W. DUDAS
*Director of the United States Patent and Trademark Office*